(12) United States Patent
Lee et al.

(10) Patent No.: US 10,454,068 B2
(45) Date of Patent: Oct. 22, 2019

(54) ORGANIC LIGHT EMITTING DISPLAY AND METHOD OF MANUFACTURING THE SAME

(71) Applicant: LG DISPLAY CO., LTD., Seoul (KR)

(72) Inventors: Joon Suk Lee, Seoul (KR); Se June Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/653,151

(22) PCT Filed: Dec. 26, 2013

(86) PCT No.: PCT/KR2013/012230
§ 371 (c)(1),
(2) Date: Jun. 17, 2015

(87) PCT Pub. No.: WO2014/104766
PCT Pub. Date: Jul. 3, 2014

(65) Prior Publication Data
US 2015/0340655 A1    Nov. 26, 2015

(30) Foreign Application Priority Data

Dec. 27, 2012  (KR) .......................... 10-2012-0155275

(51) Int. Cl.
H01L 51/52    (2006.01)
H01L 27/32    (2006.01)
(Continued)

(52) U.S. Cl.
CPC ........ H01L 51/5259 (2013.01); H01L 27/322 (2013.01); H01L 27/3211 (2013.01);
(Continued)

(58) Field of Classification Search
CPC ............... H01L 51/525; H01L 51/0096; H01L 51/5246; H01L 51/5253; H01L 51/5259;
(Continued)

(56) References Cited

U.S. PATENT DOCUMENTS 6,111,355 A    8/2000 Inoue et al.
6,432,415 B1 *  8/2002 Osborne .............. A61K 9/7015
                                                424/400
(Continued)

FOREIGN PATENT DOCUMENTS

CN    1479562 A    3/2004
CN    1638549 A    7/2005
(Continued)

OTHER PUBLICATIONS

Office Action of Chinese Patent Office in Appl'n No. 201380068173.0, dated Dec. 4, 2017.

*Primary Examiner* — Vongsavanh Sengdara
(74) *Attorney, Agent, or Firm* — Dentons US LLP

(57) ABSTRACT

There are provided an organic light emitting display and a method of manufacturing the organic light emitting display. The organic light emitting display includes a lower substrate including a plurality of subpixel regions, a thin film transistor formed on the lower substrate, an organic light emitting element formed on the thin film transistor, an encapsulation unit for covering the organic light emitting element, a spacer formed on the encapsulation unit, an upper substrate disposed to face the lower substrate, and a desiccant between the lower substrate and the upper substrate. Various embodiments of the invention provide an organic light emitting display that enhances a viewing angle by minimizing a cell gap and minimizing a distortion of light, minimizes penetration of water or oxygen from the outside, and realizes a high resolution display by enhancing an aperture ratio, and a method of manufacturing the organic light emitting display.

19 Claims, 12 Drawing Sheets

(51) Int. Cl.
  *H01L 51/00* (2006.01)
  *H01L 51/56* (2006.01)

(52) U.S. Cl.
  CPC ...... *H01L 27/3244* (2013.01); *H01L 51/0096* (2013.01); *H01L 51/525* (2013.01); *H01L 51/5246* (2013.01); *H01L 51/5253* (2013.01); *H01L 51/5284* (2013.01); *H01L 51/56* (2013.01); *H01L 27/326* (2013.01); *H01L 2251/5315* (2013.01); *H01L 2251/5338* (2013.01)

(58) Field of Classification Search
  CPC . H01L 51/5284; H01L 51/56; H01L 27/3211; H01L 27/322; H01L 27/3244; H01L 27/326; H01L 2251/5315; H01L 2251/5338
  See application file for complete search history.

(56) References Cited

U.S. PATENT DOCUMENTS

| | | | |
|---|---|---|---|
| 6,833,668 B1 * | 12/2004 | Yamada | H01L 51/5246 313/505 |
| 2005/0179379 A1 | 8/2005 | Kim | |
| 2005/0212413 A1 | 9/2005 | Matsuura et al. | |
| 2008/0150419 A1 * | 6/2008 | Kang | H01L 51/524 313/504 |
| 2008/0203909 A1 | 8/2008 | Azuma | |
| 2008/0284331 A1 * | 11/2008 | Hayashi | H01L 51/5246 313/512 |
| 2009/0009055 A1 | 1/2009 | Han et al. | |
| 2009/0251775 A1 | 10/2009 | Jung et al. | |
| 2009/0315450 A1 * | 12/2009 | Kim | H01L 27/3258 313/504 |
| 2011/0122053 A1 * | 5/2011 | Jeong | H01L 51/5275 345/76 |
| 2011/0128475 A1 | 6/2011 | Park et al. | |
| 2012/0168796 A1 | 7/2012 | Moon et al. | |

FOREIGN PATENT DOCUMENTS

| | | |
|---|---|---|
| CN | 1929707 A | 3/2007 |
| CN | 101232013 A | 7/2008 |
| CN | 102132440 A | 7/2011 |
| EP | 2412674 A1 | 2/2012 |
| JP | 2012-500461 A | 1/2012 |
| KR | 1020080101690 A | 11/2008 |
| KR | 10-2009-0002712 A | 1/2009 |
| KR | 10-2009-0002712 U | 3/2009 |
| KR | 1020090099267 A | 9/2009 |
| KR | 20100060975 A | 6/2010 |
| KR | 1020100063235 A | 6/2010 |
| KR | 102011061899 A | 6/2011 |
| KR | 1020110133566 A | 12/2011 |
| KR | 10-2012-0089950 A | 8/2012 |

* cited by examiner

[Fig. 1a]
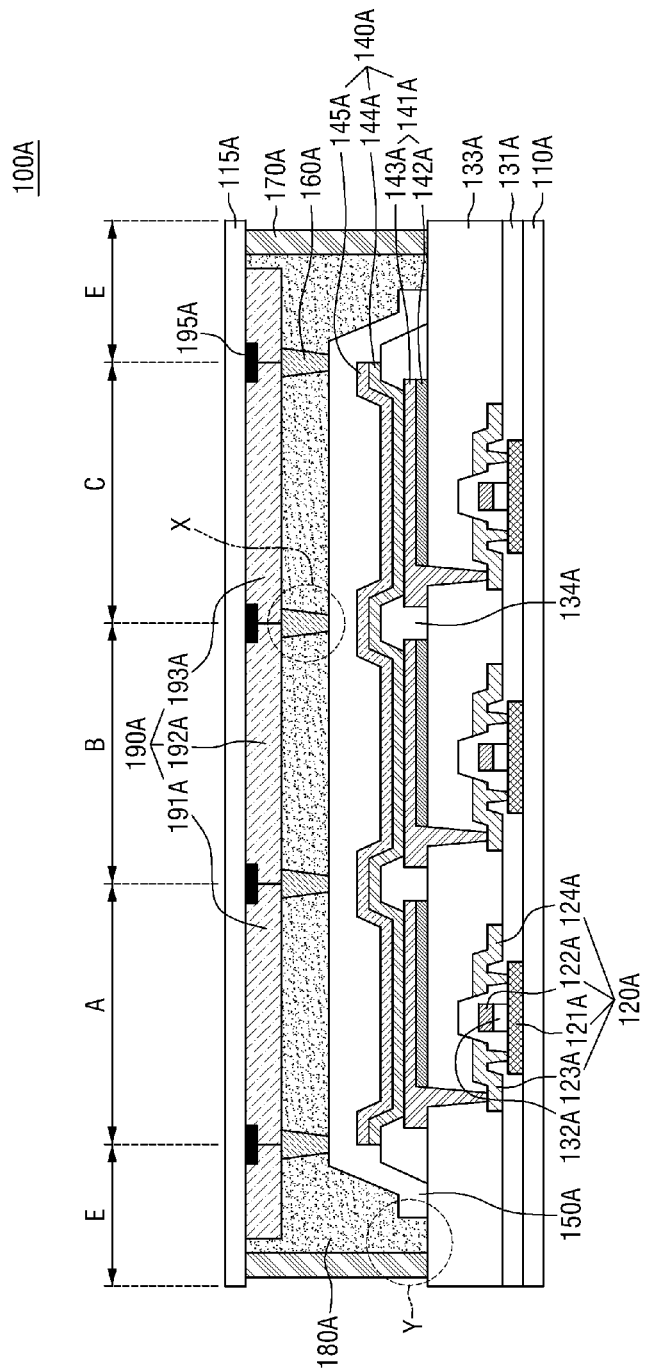

[Fig. 1b]
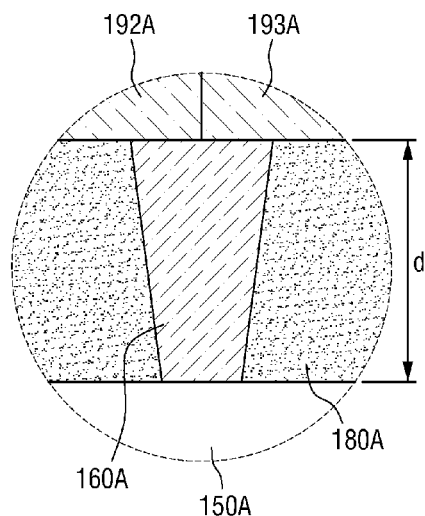
[Fig. 1c]
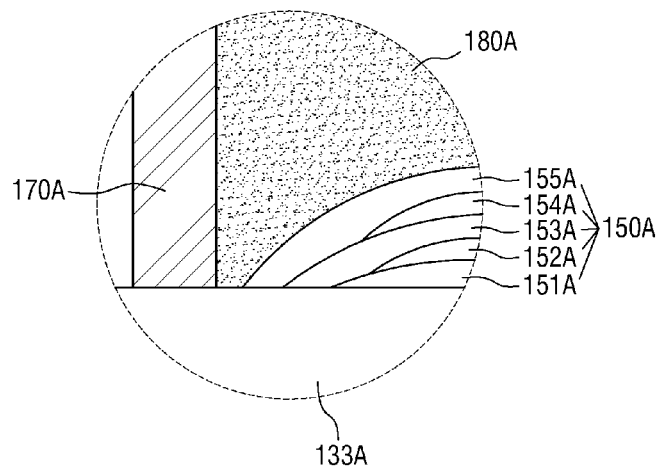

[Fig. 1d]
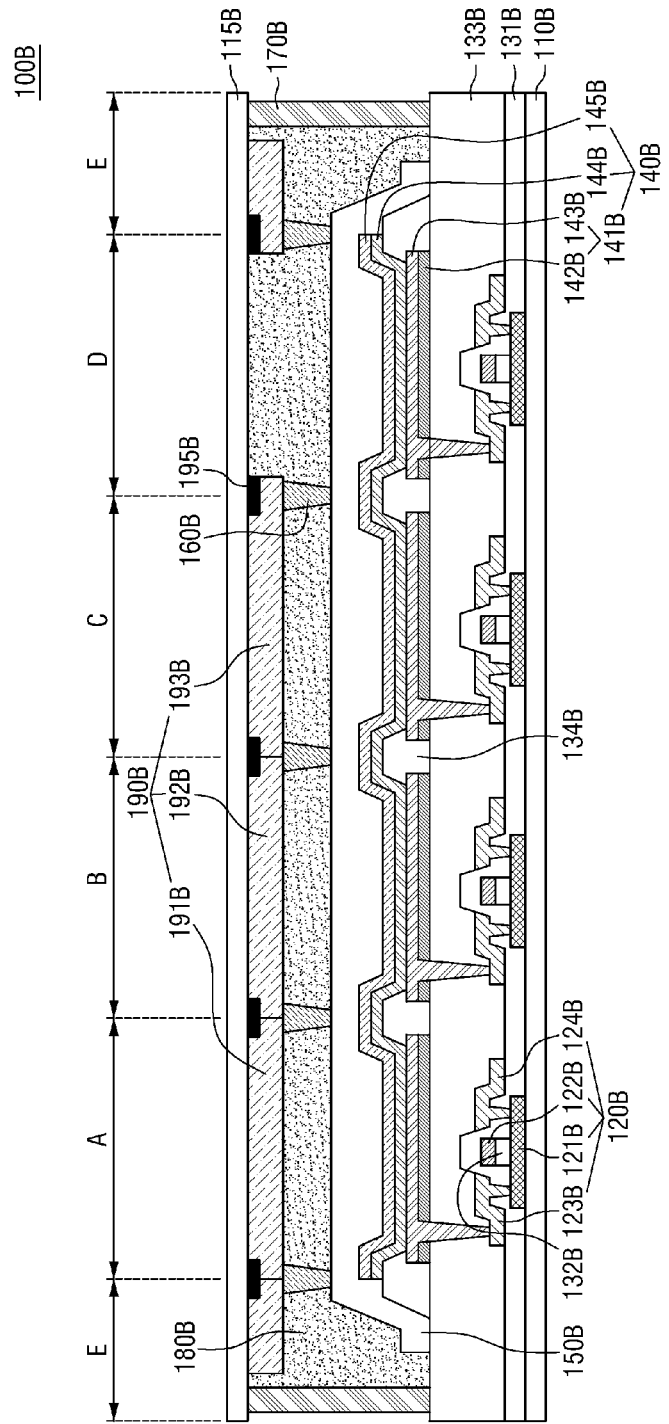

[Fig. 1e]
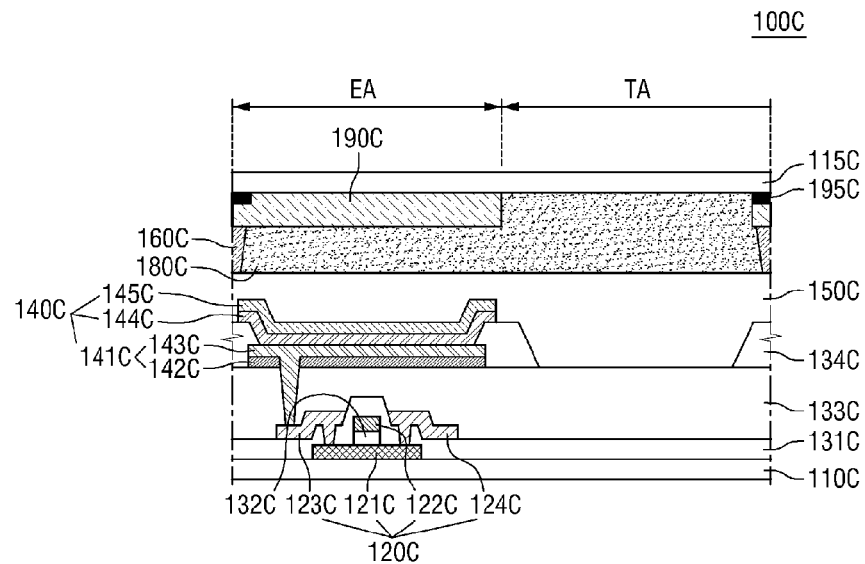
[Fig. 2a]
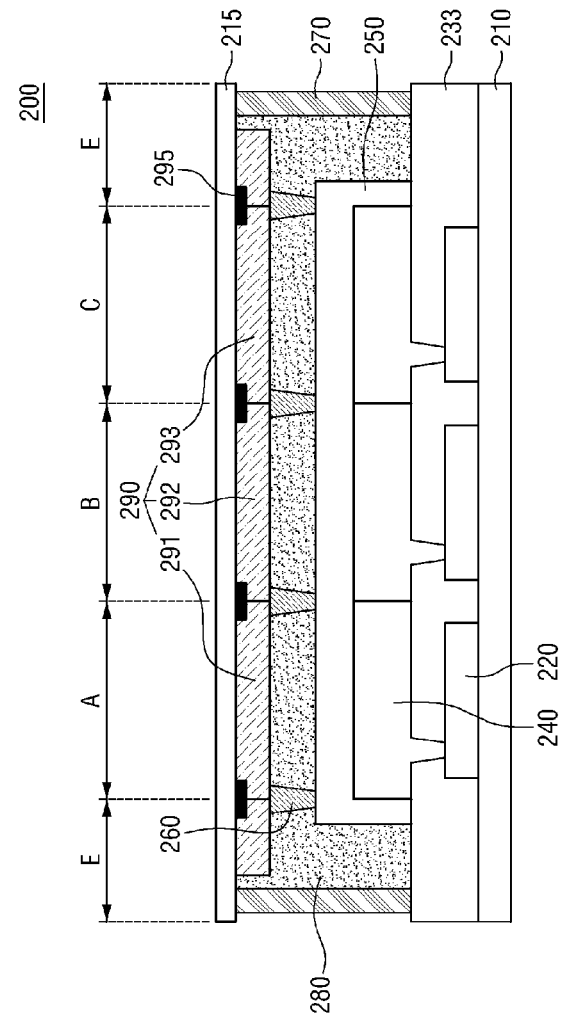

[Fig. 2b]
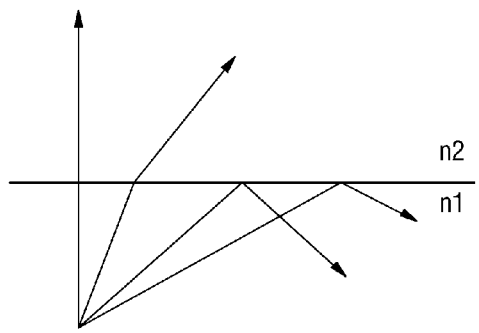
(a)
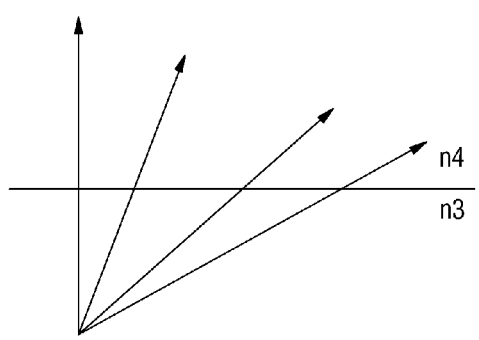
(b)
[Fig. 3a]
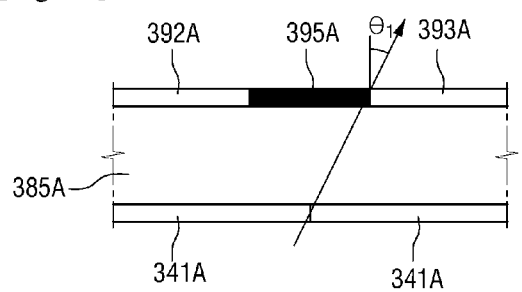
[Fig. 3b]
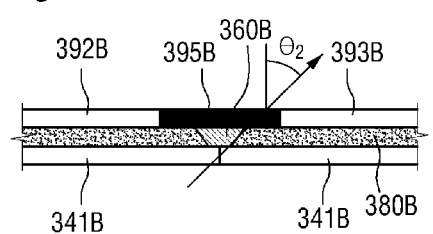

[Fig. 4]
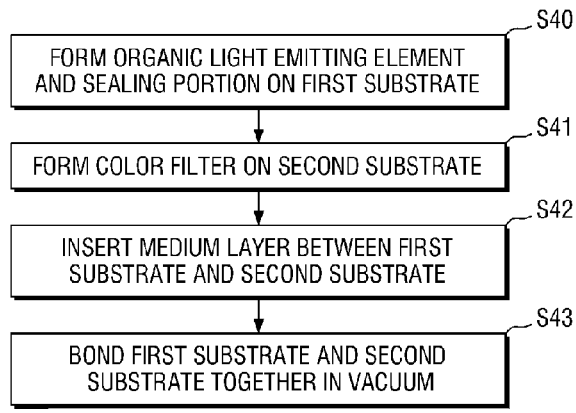
[Fig. 5a]
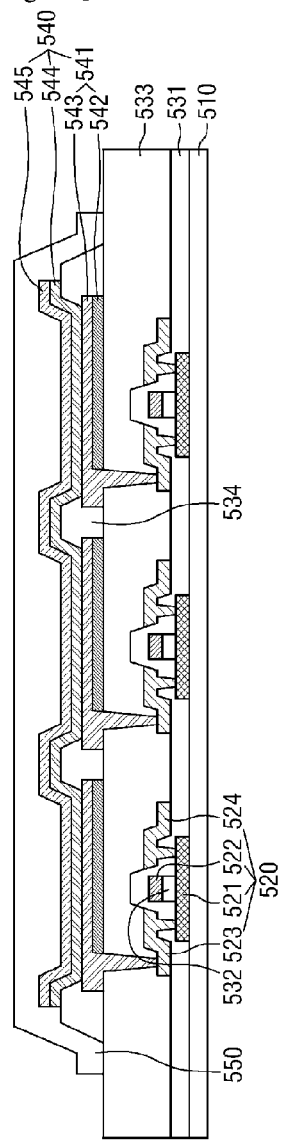

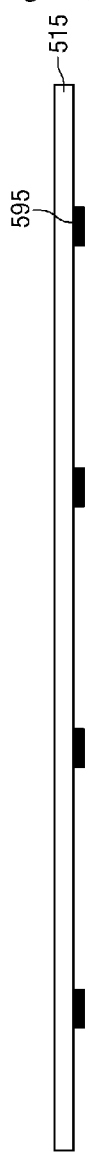
[Fig. 5b]

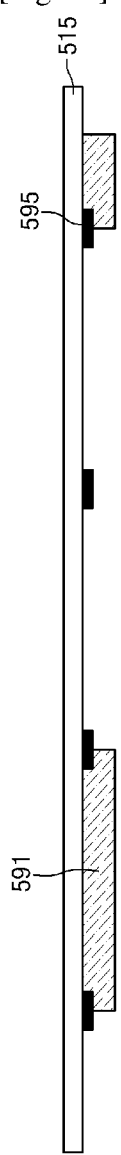

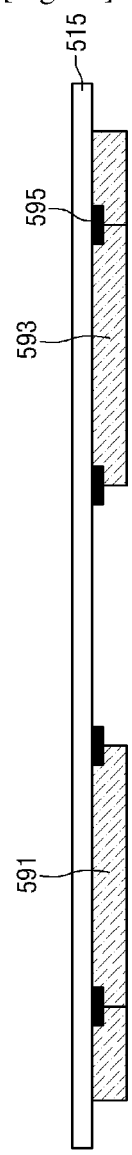

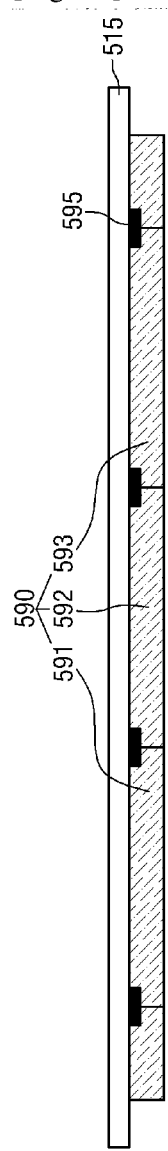

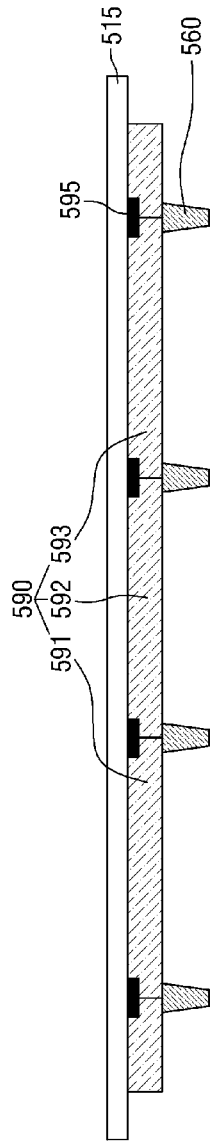

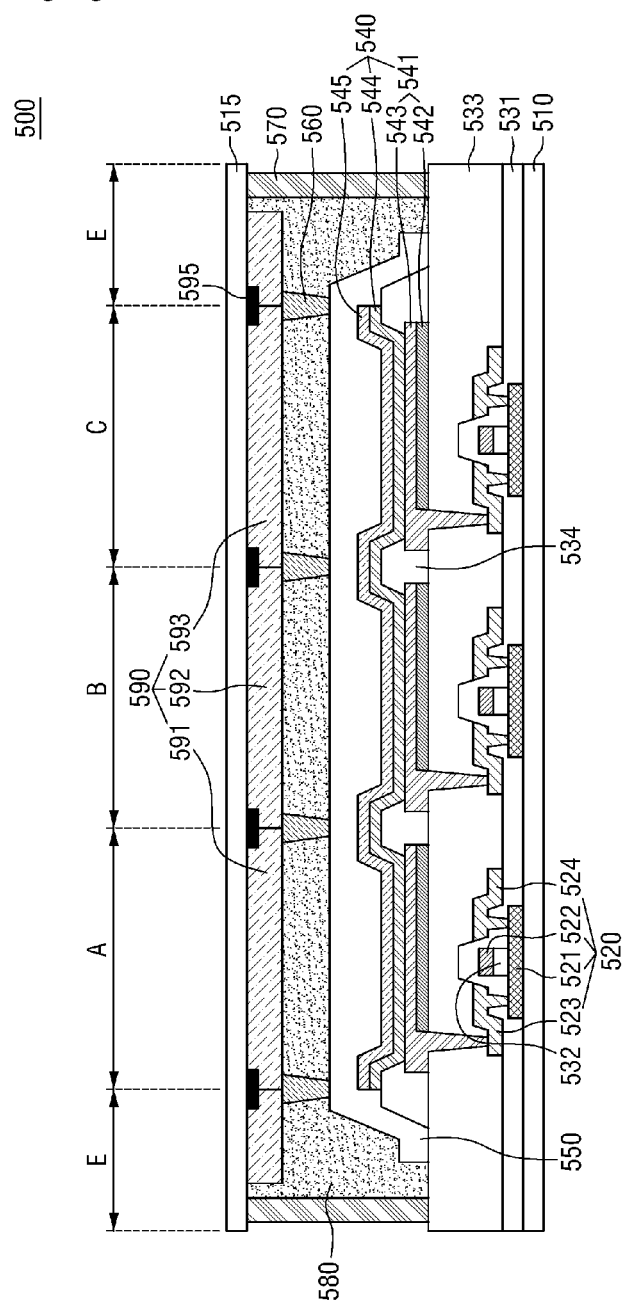
[Fig. 5g]

ORGANIC LIGHT EMITTING DISPLAY AND METHOD OF MANUFACTURING THE SAME

TECHNICAL FIELD

CROSS-REFERENCE TO RELATED APPLICATIONS

This application is a 35 U.S.C. § 371 National Stage Entry of International Application No. PCT/KR2013/012230 filed Dec. 26, 2013, which claims priority to Korean Patent Application No. 10-2012-0155275 filed Dec. 27, 2012, both of which are incorporated by reference for all purposes as if fully set forth herein.

BACKGROUND OF THE INVENTION

Field of the Invention

The present invention relates to an organic light emitting display and a method of manufacturing the organic light emitting display, in particular, relates to an organic light emitting display that minimizes a cell gap to enhance a viewing angle, and realize a high resolution display, and minimizes a transmission of humidity into an organic light emitting element, and a method for manufacturing the organic light emitting display.

Description of the Related Art

An organic light emitting display is a self light-emitting display device, and may be manufactured to be light and thin since a separate light source may not be used unlike a liquid crystal display. In addition, the organic light emitting display has an advantage in terms of power consumption due to a low voltage driving, and is excellent in a color embodiment, a response speed, a viewing angle, and a contrast ratio and thus, is being studied as a next generation display.

The organic light emitting display uses color expression schemes including a scheme of forming and using an organic light emitting element that emits red light, green light, and blue light for each pixel region, and a scheme of forming an organic light emitting element that emits white light in all pixel regions, and using a color filter. Between the color expression schemes, whereas the scheme of forming and using an organic light emitting element that emits different colors for each pixel region has difficulty in a fabrication process, the scheme of using a white organic light emitting element and a color filter has an advantage in terms of productivity, realizing of a high resolution, and the like and thus, is being widely studied.

In addition, the organic light emitting display uses a top emission type, a bottom emission type, and a both-sides emission type classified according to a direction of emitting light.

SUMMARY OF THE INVENTION

When an organic light emitting display emits light using a top emission type, a lower substrate and an upper substrate of the organic light emitting display are bonded to each other by a sealing material, and a sealing material such as a face seal is used as the sealing material. However, when an upper substrate and a lower substrate are bonded to each other using a face seal scheme, a cell gap increases due to a thickness of a face seal and thus, a viewing angle is narrowed. Therefore, the inventors of the invention conceived an organic light emitting display that enhances a viewing angle by minimizing a cell gap and a method of manufacturing the organic light emitting display to resolve an issue of a narrow viewing angle described above.

Further, an object to be solved by the invention is to provide an organic light emitting display that minimizes penetration of water or oxygen from the outside, and a method of manufacturing the organic light emitting display.

Another object to be solved by the invention is to provide an organic light emitting display that enhances visibility by minimizing a distortion of light due to a difference in refractive indexes between internal elements, and a method of manufacturing the organic light emitting display.

Still another object to be solved by the invention is to provide an organic light emitting display that realizes a high resolution display by decreasing a size of a black matrix to enhance an aperture ratio, and a method of manufacturing the organic light emitting display.

Yet another object to be solved by the invention is to provide an organic light emitting display that decreases a size of a bezel area by using a desiccant in an edge seal scheme of attaching an upper substrate and a lower substrate to each other in an edge region rather than a face seal scheme in a space between the upper substrate and the lower substrate, and a method of manufacturing the organic light emitting display.

Objects of the invention are not limited to the objects mentioned above, and other objects not mentioned may be clearly understood by a person skilled in the art from description below.

There is provided an organic light emitting display including a desiccant according to embodiments of the invention. A lower substrate and an upper substrate are disposed to face each other. A thin film transistor and an organic light emitting element are stacked on the lower substrate including a plurality of subpixel regions. An encapsulation unit covers the organic light emitting element, and a spacer is formed on the encapsulation unit. The desiccant fills a space between the lower substrate and the upper substrate. In the organic light emitting display, both the encapsulation unit and the desiccant are used to minimize penetration of water or oxygen from the outside. Therefore, it is possible to minimize the number of times of alternately stacking an organic layer and an inorganic layer used as the encapsulation unit and thus, it is possible to decrease a size of a bezel area. In addition, it is possible to minimize water and oxygen that may penetrate from a side of the organic light emitting display when compared to a case of using a face seal scheme.

There is provided an organic light emitting display including a medium layer for a refractive index matching according to embodiments of the invention. The medium layer is positioned between a lower substrate, in which an organic light emitting element and an encapsulation unit for covering the organic light emitting element are formed, and an upper substrate in which a color filter is formed. The medium layer has a refractive index substantially identical to a refractive index of the upper substrate. The medium layer may enhance visibility by minimizing a distortion of light due to a difference in refractive indexes between internal elements to which light emitted from the organic light emitting element penetrates.

There is provided an organic light emitting display for enhancing visibility according to embodiments of the invention. A spacer for maintaining a cell gap between an upper substrate and a lower substrate is formed between the upper substrate and the lower substrate to enhance visibility. The organic light emitting display may enhance a viewing angle when compared to a case of using a face seal scheme by using the spacer that maintains a cell gap. In addition, since a viewing angle is enhanced, an aperture ratio is improved by decreasing a size of a black matrix that may be formed on the upper substrate. Accordingly, a high resolution display may be realized.

There is provided a method of manufacturing an organic light emitting display according to embodiments of the invention. The method of manufacturing an organic light emitting display includes forming an organic light emitting element and an encapsulation unit that covers the organic light emitting element on a lower substrate, forming a color filter on an upper substrate, forming a spacer on the color filter, injecting a desiccant between the lower substrate and the upper substrate, and bonding the lower substrate and the upper substrate together. The manufacturing method described above employs a scheme of forming an encapsulation unit, injecting a desiccant, and bonding an upper substrate and a lower substrate together. Therefore, it is possible to minimize the number of times of alternately stacking an organic layer and an inorganic layer used as the encapsulation unit, and it is possible to minimize water and oxygen that may flow into the organic light emitting element.

Other details of the embodiments are included in the detailed description and the drawings.

BRIEF DESCRIPTION OF DRAWINGS

The above and other aspects, features and other advantages of the present invention will be more clearly understood from the following detailed description taken in conjunction with the accompanying drawings, in which:

FIG. 1a is a cross-sectional view of an organic light emitting display including a desiccant according to embodiments of the invention;

FIG. 1b is an enlarged view of an area X of FIG. 1a;

FIG. 1c is an enlarged view of an area Y of FIG. 1a;

FIG. 1d is a cross-sectional view of an organic light emitting display including a white subpixel region according to embodiments of the invention;

FIG. 1e is a cross-sectional view corresponding to a case in which an organic light emitting display according to embodiments of the invention is a transparent organic light emitting display;

FIG. 2a a conceptual diagram illustrating an organic light emitting display including a medium layer for a refractive index matching according to embodiments of the invention;

FIG. 2b is conceptual diagrams illustrating a refractive index matching of an organic light emitting display according to embodiments of the invention;

FIGS. 3a and 3b are conceptual diagrams illustrating an organic light emitting display for enhancing a viewing angle according to embodiments of the invention;

FIG. 4 is a flowchart illustrating a method of manufacturing an organic light emitting display according to embodiments of the invention; and FIGS. 5a to 5g are cross-sectional views for each process illustrating a method of manufacturing an organic light emitting display according to embodiments of the invention.

DETAILED DESCRIPTION OF THE PREFERRED EMBODIMENT

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

In this specification, like numbers refer to like elements throughout the description of the drawings.

Although first, second, and the like are used in order to describe various components, the components are not limited by the terms. The above terms are used only to discriminate one component from the other component. Therefore, a first component mentioned below may be a second component within the technical spirit of the present invention.

In the drawings, size and thickness of each element are arbitrarily illustrated for convenience of description, and the present invention is not necessarily limited to those illustrated in the drawings.

In this specification, an organic light emitting display of a top emission type refers to an organic light emitting display in which light emitted from an organic light emitting element is discharged to a top of the organic light emitting display. Light emitted from the organic light emitting element of the organic light emitting display of the top emission type is discharged toward an upper surface of a substrate on which a thin film transistor for driving the organic light emitting display is formed.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship.

Hereinafter, embodiments of the invention are described with reference to accompanying drawings.

FIG. 1a is a cross-sectional view of an organic light emitting display including a desiccant according to embodiments of the invention. Referring to FIG. 1a, an organic light emitting display 100A includes a lower substrate 110A, a thin film transistor 120A, an organic light emitting element 140A, an encapsulation unit 150A, a spacer 160A, a desiccant 180A, an adhesive member 170A, a color filter 190A, a black matrix 195A, and an upper substrate 115A.

FIG. 1a illustrates a single pixel region including a single red subpixel region A, a single green subpixel region B, and a single blue subpixel region C. However, it should be appreciated that the organic light emitting display includes a plurality of pixel regions in a matrix form and the arrangement of the subpixel regions may vary among the pixel regions of the organic light emitting display. For instance, some pixel regions may have different set of subpixel regions from other pixel regions. Also, a subpixel region may be shared among a plurality of adjacent pixels.

The lower substrate 110A is a substrate for supporting and protecting several elements of the organic light emitting display 100A. The lower substrate 110A may be formed of an insulation material, for example, glass or plastic. However, the invention is not limited thereto, and the lower substrate 110A may include various materials.

The lower substrate 110A may include a display region and a non-display region. The display region is a region where an image is displayed, and refers to a region including the pixels and subpixels (e.g., red subpixel region A, the green subpixel region B, and the blue subpixel region C). The non-display region is a region where no image is displayed, and refers to an edge region E.

The thin film transistor 120A is formed on the lower substrate 110A. The thin film transistor 120A includes an active layer 121A, a gate electrode 122A, a source electrode 123A, and a drain electrode 124A. The thin film transistor 120A is formed for each subpixel region on the lower substrate 110A, and enables an independent driving for each subpixel region. In this specification, a driving thin film transistor 120A is illustrated among various thin film transistors that may be included in the organic light emitting display 100A for convenience of description. In addition, in this specification, the thin film transistor 120A is described as a coplanar thin film transistor. However, an inverted staggered thin film transistor may be used.

A buffer layer may be formed on the lower substrate 110A. The buffer layer may prevent penetration of water or an impurity through the lower substrate 110A, and flatten a surface of the lower substrate 110A. However, the buffer layer may not be included, and may be employed depending on a type of the lower substrate 110A or a type of the thin film transistor 120A used in the organic light emitting display 100A.

The active layer 121A is formed on the lower substrate 110A. A gate insulating film 132A is formed on the active layer 121A to insulate the active layer 121A from the gate electrode 122A. As illustrated in FIG. 1a, the gate insulating film 132A may be formed only on the active layer 121A, and may be formed over the entire lower substrate 110A.

The gate electrode 122A is formed on the gate insulating film 132A.

An interlayer insulating film 131A is formed on the gate electrode 122A. The interlayer insulating film 131A is formed to have a contact hole that opens a portion of the active layer 121A.

The source electrode 123A and the drain electrode 124A are formed on the interlayer insulating film 131A. Each of the source electrode 123A and the drain electrode 124A is electrically connected to the active layer 121A through the contact hole formed in the interlayer insulating film 131A.

A passivation film may be formed on the source electrode 123A and the drain electrode 124A. When the passivation film is formed, the passivation film may be formed to include a contact hole exposing the source electrode 123A or the drain electrode 124A.

An over coating layer 133A that flattens a top of the lower substrate 110A is formed on the source electrode 123A and the drain electrode 124A. The over coating layer 133A is formed to have a contact hole that opens a portion of the source electrode 123A.

An anode 141A is formed on the over coating layer 133A. The anode 141A is connected to the source electrode 123A of the thin film transistor 120A through the contact hole formed in the over coating layer 133A. The anode 141A supplies a positive hole and thus, is formed using a conductive material having a high work function. As illustrated in FIG. 1a, when the organic light emitting display 100A is a top emission type organic light emitting display, the anode 141A includes a reflective layer 142A formed below a transparent conductive layer 143A to discharge light emitted from an organic emission layer 144A to a top of the organic light emitting display 100A.

The anode 141A is separately formed for each subpixel region, and is electrically connected to a separate thin film transistor 120A. Thus, each subpixel region may be individually driven.

A bank layer 134A is formed on the over coating layer 133A. The bank layer 134A is disposed between adjacent subpixel regions to divide the adjacent subpixel regions.

The organic light emitting display 100A is described as using the white organic emission layer 144A and the color filter 190A. The organic emission layer 144A emitting white light is formed on the anode 141A. The organic emission layers 144A is illustrated as being formed continuously in the red subpixel region A, the green subpixel region B and the blue subpixel region C, and connected to one another for convenience of description. However, it should be noted that the organic emission layers 144A needs not be formed as such and may be separately formed in the red subpixel region A, the green subpixel region B, and the blue subpixel region C.

A cathode 145A is formed on the organic emission layer 144A. The cathode 145A is connected to a separate voltage wire to apply the same voltage to all subpixel regions. The cathode 145A supplies an electron and thus, is formed using a material having a high electrical conductivity and a low work function. As illustrated in FIG. 1a, when the organic light emitting display 100A is a top emission type organic light emitting display, the cathode 145A may be thinly formed to have a thickness less than or equal to a predetermined thickness (for example, 200 Å) so that light emitted from the organic emission layer 144A penetrates into the top of the organic light emitting display 100A.

The organic light emitting element 140A includes the anode 141A, the organic emission layer 144A, and the cathode 145A, and is driven such that a hole supplied from the anode 141A and an electron supplied from the cathode 145A combine in the organic emission layer 144A to emit light.

The encapsulation unit 150A is formed on the organic light emitting element 140A as a sealing member that covers the organic light emitting element 140A. The encapsulation unit 150A may protect internal elements of the organic light emitting display 100A such as the thin film transistor 120A and the organic light emitting element 140A from water, oxygen, an impact, and the like from the outside. As the encapsulation unit 150A, an inorganic and/or organic thin film may be used. For instance, the encapsulation unit 150A may be formed by alternately stacking an organic thin film(s) and an inorganic thin film(s).

The upper substrate 115A is a substrate for supporting and protecting several elements of the organic light emitting display 100A, and is disposed to face the lower substrate 110A.

The black matrix 195A is formed on the upper substrate 115A. The black matrix 195A is formed on a boundary of the subpixel region. The black matrix 195A may be formed using chrome (Cr) or other opaque metal films, and may be formed using a resin.

The color filter 190A is formed on the upper substrate 115A. The color filter 190A may be formed for each subpixel region on the upper substrate 115A, and includes a red color filter 191A formed in the red subpixel region A, a green color filter 192A formed in the green subpixel region B, and a blue color filter 193A formed in the blue subpixel region C. Thus, white light emitted by the organic emission layer 144A that emits white light is converted to red light by passing through the red color filter 191A formed in the red subpixel region A, is converted to green light by passing through the green color filter 192A formed in the green subpixel region B, and is converted to blue light by passing through the blue color filter 193A formed in the blue subpixel region C.

The spacer 160A is formed on the upper substrate 115A where the color filter 190A is formed. The spacer 160A is employed to form a space between the upper substrate 115A and the lower substrate 110A for holding desiccant 180A. The distance between the upper substrate 115A and the lower substrate 110A, known as the "cell gap," refers to a minimum distance among distances between an element formed on the upper substrate 115A and an element formed on the lower substrate 110A. The constituent material and the shape of the spacer 160A are not limited. The spacer 160A may be formed in various shapes such as a shape of a ball and/or a shape of a pillar. The spacer 160A may be formed using a transparent insulation material and/or an opaque insulation material. The spacer 160A may affect the display capability (e.g., aperture ratio, light output efficiency, etc.) of the organic light emitting display 100A depending on the shape, size and/or the constituent material of the spacer 160A. Accordingly, the spacer 160A may be positioned to overlap with the black matrix 195A.

As described above, the thin film transistor 120A, the organic light emitting element 140A and the encapsulation unit 150A are formed on the lower substrate 110A. Also, the black matrix 195A, the color filter 190A and the spacer 160A are formed on the upper substrate 115A. The lower substrate 110A and the upper substrate 115A are attached together. The lower substrate 110A and the upper substrate 115A may be attached together by various methods. In way of an example, the lower substrate 110A and the upper substrate 115A may be attached by a vacuum bonding scheme within a vacuum chamber. When the lower substrate 110A and the upper substrate 115A are attached together, the spacer 160A can be used to align the lower substrate 11A and the upper substrate 115A. The spacer 160A overlaps the black matrix 195A on a side of the upper substrate 115A, and overlaps the bank layer 134A of the lower substrate 110A, and comes into contact with the encapsulation unit 150A when the upper substrate 115A and the lower substrate 110A are joined.

The adhesive member 170A is used to attach the upper substrate 115A and the lower substrate 110A to each other. The adhesive member 170A is formed in the edge region E of the upper substrate 115A and the lower substrate 110A to maintain a state in which the upper substrate 115A and the lower substrate 110A are bonded together in a vacuum. The adhesive member 170A may be formed using a glass frit.

The desiccant 180A is disposed in a separation space between the upper substrate 115A and the lower substrate 110A. When the separation space between the upper substrate 115A and the lower substrate 110A is not filled with the desiccant 180A, the organic light emitting display 100A may be vulnerable to water and oxygen penetrating from the outside of the organic light emitting display 100A. For example, the organic light emitting display 100A is much more vulnerable to water and oxygen penetrating from the outside of the organic light emitting display 100A when the separation space between the upper substrate 115A and the lower substrate 110A is empty or filled with a gas such as nitrogen (N2). Accordingly, in the organic light emitting display 100A according to embodiments of the invention, the separation space between the upper substrate 115A and the lower substrate 110A formed by the spacer 160A is filled with a desiccant 180A that inhibits penetration of water and oxygen.

The desiccant 180A includes a material that absorbs water, or hinders water and oxygen from proceeding. The desiccant 180A may absorb water, or hinder water from proceeding by chemically reacting with water penetrating from the outside of the organic light emitting display 100A, and may inhibit physical penetration of water penetrating from the outside of the organic light emitting display 100A. The desiccant 180A may correspond to a type of alcohol. In particular, a compound including carbon (C), hydrogen (H), and a hydroxyl group (OH) may be used. For example, the desiccant 180A may correspond to glycerine. In this specification, description is made on the assumption that the desiccant 180A corresponds to glycerine. However, the desiccant 180A is not limited to glycerine, and may include a material capable of absorbing water or hindering water from proceeding by chemically reacting with water penetrating from the outside of the organic light emitting display 100A. Examples of the desiccant 180A may include at least one of glycerol, 1,2-propanediol, trimethylopropane, triethanolamine, ethylene glycol, 1,3-propanediol, 1,4-butanediol, 1,8-octanediol, 1,2-butanediol, 2,3-butanediol, 1,2-pentanediol, etohexadiol, p-methane-3,8-diol, and 2-methyl-2,4-pentanediol.

The desiccant 180A in a liquid state fills the separation space between the upper substrate 115A and the lower substrate 110A, in particular, fills a space between the encapsulation unit 150A and the adhesive member 170A. For example, when glycerine is used as the desiccant 180A, glycerin in a liquid state is injected into the separation space between the upper substrate 115A and the lower substrate 110A to fill the separation space between the upper substrate 115A and the lower substrate 110A. The desiccant 180A may be in a gelled state. For example, when glycerine is used as the desiccant 180A, and glycerine is hardened using a hardener and the like after the separation space between the upper substrate 115A and the lower substrate 110A is filled with glycerine in a liquid state, the separation space between the upper substrate 115A and the lower substrate 110A may be filled with the desiccant 180A in a gelled state.

Further, the desiccant 180A may be formed of a material having substantially the same refractive index as a refractive index of the upper substrate 115A to enhance visibility. That is, the difference between the refractive indices of the material forming the upper substrate 115A and the material for forming the desiccant 180A may be equal to or less than 0.5. For instance, the refractive index of the upper substrate 115A and the material forming the desiccant 180A may be about 1.5.

FIG. 1b is an enlarged view of an area X of FIG. 1a. Referring to FIG. 1b, the spacer 160A has a height to maintain a cell gap sufficient to hold desiccant 180A between the upper substrate 115A and the lower substrate 110A. For example, the spacer 160A may have a height less than equal to about 20 μm. In addition, a surface of the encapsulation unit 150A coming into contact with the spacer 160A is flat.

Employing the spacer 160A as described in the embodiments of the present disclosure provides several advantages over the conventional organic light element using a face seal scheme. When a face seal scheme is used as a scheme of bonding the upper substrate and the lower substrate together, the face seal is formed a UV curable material or a thermosetting material. The face seal generally requires a thickness of about 100 μm to bond the upper substrate and the lower substrate together and to obtain stable encapsulation. This results in a large cell gap between the upper substrate and the lower substrate, which degrades the optical performance of the organic light emitting display. In the organic light emitting display 100A, however, the spacer 160A is used to create a space to hold the desiccant 180A between the lower substrate 110A and the upper substrate 115A, and the substrates are attached together in vacuum. In this way, the cell gap between the lower substrate 110A and the upper substrate 115A can be significantly reduced while providing comparable or even improved encapsulation functionality as that of the organic light emitting display employing the face seal scheme. Further, the reduction of the cell gap leads to improved optical performance of the organic light emitting display 100A.

FIG. 1c is an enlarged view of an area Y of FIG. 1A. Referring to FIG. 1c, description is made on the assumption that the encapsulation unit 150A includes a structure in which inorganic layers 151A, 153A, and 155A corresponding to inorganic thin films and organic layers 152A and 154A corresponding to organic thin films are alternately stacked a plurality of times to more simply describe the desiccant 180A according to embodiments of the invention.

The encapsulation unit 150A and the adhesive member 170A are separated from each other, and the desiccant 180A fills a separation space between the encapsulation unit 150A and the adhesive member 170A. The encapsulation unit 150A is a thin film encapsulation unit, and includes a structure in which the inorganic layers 151A, 153A, and 155A and the organic layers 152A and 154A are alternately stacked. Since the inorganic layers 151A, 153A, and 155A are relatively excellent in a encapsulating effect when compared to the organic layers 152A and 154A, the inorganic layers 151A and 155A are disposed on a lowermost layer and an uppermost layer of the encapsulation unit 150A, respectively. FIG. 1c illustrates that the encapsulation unit 150A includes a structure in which the inorganic layers 151A, 153A, and 155A and the organic layers 152A and 154A are alternately stacked for convenience of description. However, the invention is not limited thereto, and the number of times at which the inorganic layers 151A, 153A, and 155A and the organic layers 152A and 154A are alternately stacked may be variously changed.

Water and oxygen may penetrate the organic light emitting display 100A from the outside of the organic light emitting display, particularly, from a top, a bottom, and a side of the organic light emitting display. Various elements capable of blocking water and oxygen are disposed at the top and the bottom of the organic light emitting display. In particular, the encapsulation unit is disposed at a top of the organic emission layer and thus, water and oxygen are relatively easily blocked. However, the adhesive member into which water and oxygen relatively easily penetrate is positioned at the side of the organic light emitting display, and water and oxygen may relatively easily penetrate the organic light emitting display from the side of the organic light emitting display through an attaching space between the over coating layer and an end of the encapsulation unit formed on the side of the organic light emitting display. While additional organic/inorganic layers can be used to reduce the permeation of water and oxygen from the side of the organic light emitting display, each addition of layers inevitably leads to increase in the cell gap, which in turn causes degradation of optical performance (e.g. light output efficiency, viewing angle, etc.) of the organic light emitting display. Also, the addition of organic/inorganic layers will increase the length of the encapsulation unit towards the edge region, and results in larger bezel area.

In the organic light emitting display 100A according to embodiments of the invention, it is possible to minimize water and oxygen that may penetrate the organic light emitting display 100A from the outside of the organic light emitting display 100A, in particular, from the side of the organic light emitting display 100A by employing the desiccant 180A which fills the separation space between the encapsulation unit 150A and the adhesive member 170A. In addition, the number of times at which the organic layers 152A and 154A and the inorganic layers 151A, 153A, and 155A of the encapsulation unit 150A are alternately stacked may be decreased by filling the separation space between the encapsulation unit 150A and the adhesive member 170A with the desiccant 180A. Thus, the bezel area may be decreased when compared to a case of using the face seal scheme.

A polarizing film may be disposed on the upper substrate 115A. The polarizing film may enhance a feature of straightness of light emitted from the organic emission layer 144A to prevent scattering or interference, and enhance a feeling of color. Further, the polarizing film may selectively transmit external light, and prevent reflection of external light to enhance visibility of the organic light emitting display 100A.

FIG. 1d is a cross-sectional view of an organic light emitting display including a white subpixel region according to embodiments of the invention. FIG. 1d has substantially the same configuration except that a white subpixel region D is added when compared to FIG. 1a and thus, repeated description is omitted.

A lower substrate 110B includes a pixel region including a red subpixel region A, a green subpixel region B, a blue subpixel region C, and the white subpixel region D.

The white subpixel region D is a region for emitting white light and thus, a color filter 190B is not formed in the white subpixel region D on the lower substrate 110B. Therefore, a desiccant 180B other than a color filter is disposed in a region on an upper substrate 115B corresponding to the white subpixel region D unlike the red subpixel region A, the green subpixel region B, and the blue subpixel region C.

Although not illustrated in FIG. 1d, a transparent resin layer may be formed on the upper substrate 115B corresponding to the white subpixel region D. Since the white subpixel region D is a region for emitting white light, a transparent resin for transmitting white light emitted from an organic emission layer 144B to the outside of an organic light emitting display 100B may be formed on the upper substrate 115B corresponding to the white subpixel region D.

FIG. 1e is a cross-sectional view corresponding to a case in which an organic light emitting display according to embodiments of the invention is a transparent organic light emitting display. FIG. 1e illustrates a single subpixel region for convenience of description, and the subpixel region illustrated in FIG. 1e may correspond to one of the red subpixel region A, the green subpixel region B, and the blue subpixel region C.

Referring to FIG. 1e, the subpixel region includes an emissive area EA and a transmissive area TA. The emissive area EA refers to an area in which an actual image is displayed, and the transmissive area TA refers to an area transmitting external light. Therefore, when an organic light emitting display 100C is not driven, a user may view a background, that is, an object behind a display through the transmissive area TA. When the organic light emitting display 100C is driven, a user may simultaneously view an image of the emissive area EA and a background through the transmissive area TA. An area ratio of the emissive area EA to the transmissive area TA in the subpixel region may be variously set in view of visibility and a transmittance.

A thin film transistor 120C is formed in the emissive area EA of each subpixel region. The transmissive area TA of each subpixel region is an area transmitting external light. Therefore, when the thin film transistor 120C is formed in the transmissive area TA, a transmittance decreases and thus, it is difficult to view an external image. Therefore, the thin film transistor 120C is formed in the emissive area EA as illustrated in FIG. 1e.

An anode 141C is formed in the emissive area EA. Since the transparent conductive layer 143C is transparent, a decrease in a transmittance is small when the transparent conductive layer 143C overlaps a portion of the transmissive area TA. However, when a reflective layer 142C overlaps a portion of the transmissive area TA, a transmittance of the transmissive area TA significantly decreases. Therefore, the anode 141C is formed in the emissive area EA.

A bank layer 134C is formed on an over coating layer 133C. The bank layer 134C divides the emissive area EA and the transmissive area TA in an adjacent subpixel region and a single subpixel region, and is disposed between the emissive area EA and the transmissive area TA in the adjacent subpixel region and the single subpixel region.

An organic emission layer 144C is formed in the emissive area EA. FIG. 1e illustrates that the organic emission layer 144C is formed in the emissive area EA. However, since the organic emission layer 144C is substantially transparent in a non-emissive state, the organic emission layer 144C may be formed in both the emissive area EA and the transmissive area TA for convenience of a process.

A cathode 145C is formed in the emissive area EA. FIG. 1e illustrates that the cathode 145C is formed in the emissive area EA. However, even though a transmittance decreases in the transmissive area TA, the cathode 145C may be formed in both the emissive area EA and the transmissive area TA for convenience of a process.

An encapsulation unit 150C is formed on an organic light emitting element 140C as a sealing member that covers the organic light emitting element 140C, and the encapsulation unit 150C directly comes into contact with the over coating layer 133C in the transmissive area TA. Referring to FIG. 1e, since the organic light emitting element 140C is formed in the emissive area EA, an area in the transmissive area TA corresponding to an area where the organic light emitting element 140C is formed is filled with the encapsulation unit 150C.

A black matrix 195C is formed on an upper substrate 115C. The black matrix 195C is formed on a boundary of a subpixel region, and a boundary of the emissive area EA and the transmissive area TA in the subpixel region.

A color filter 190C is formed in the emissive area EA. The transmissive area TA is an area transmitting external light of the organic light emitting display 100C rather than an area emitting light of a predetermined color. Thus, when the color filter 190C is disposed in the transmissive area TA, a color of external light may be converted to a color displayed by the color filter 190C. Therefore, the color filter 190C may be formed in the emissive area EA, and may not be formed in the transmissive area TA.

A desiccant 180B other than the color filter 190B is disposed in the transmissive area TA of the upper substrate 115C where the color filter 190C is not formed. A transparent resin layer may be formed on the upper substrate 115B corresponding to the white subpixel region D.

FIG. 2a a conceptual diagram illustrating an organic light emitting display including a medium layer for a refractive index matching according to embodiments of the invention. Referring to FIG. 2a, an organic light emitting display 200 includes a lower substrate 210, a thin film transistor 220, an organic light emitting element 240, an encapsulation unit 250, a spacer 260, a medium layer 280, an adhesive member 270, a color filter 290, a black matrix 295, and an upper substrate 215. FIG. 2a is different from FIG. 1a in that the medium layer 280 for a refractive index matching is used, and other configurations are substantially the same and thus, repeated description is omitted. The thin film transistor 220 and the organic light emitting element 240 are conceptually illustrated in FIG. 2a, and substantially the same as the thin film transistor 120A and the organic light emitting element 140A of FIG. 1a.

The upper substrate 215 may include a material having a refractive index of about 1.5. For example, the upper substrate 215 may include glass having a refractive index of about 1.5. In addition, when the upper substrate 215 includes plastic, a plastic material having a refractive index of about 1.5 may be selected as the plastic.

The color filter 290 may have substantially the same refractive index as a refractive index of the upper substrate 215 to minimize distortion of light on the inside of the organic light emitting display 200. For example, a refractive index of the color filter 290 may be about 1.5. In this specification, substantially the same refractive index includes a case in which a property of light passing through a medium is unchanged due to a difference in a refractive index even though a refractive index is not precisely the same in addition to a case in which a refractive index is precisely the same.

A separation space of the upper substrate 215 and the lower substrate 210 is filled with the medium layer 280. The medium layer 280 fills the separation space of the upper substrate 215 and the lower substrate 210 to minimize distortion on the inside of the organic light emitting display 200 of light emitted from the organic light emitting element 240, and enhance visibility of the organic light emitting display 200. The separation space of the upper substrate 215 and the lower substrate 210 refers to a space formed between an element formed on the upper substrate 215 and an element formed on the lower substrate 210 facing the element formed on the upper substrate 215, and refers to a space formed by the color filter 290, the encapsulation unit 250, and the adhesive member 270 with reference to FIG. 2a.

The medium layer 280 is disposed between the upper substrate 215 and the lower substrate 210 to match refractive indexes between elements formed on the upper substrate 215, on the lower substrate 210, and between the upper substrate 215 and the lower substrate 210.

FIG. 2b is conceptual diagrams illustrating a refractive index matching of an organic light emitting display according to embodiments of the invention. A graph (a) of FIG. 2b illustrates a case in which light travels from a medium having an refractive index n1 to a medium having an refractive index n2, and the refractive index n1 is greater than the refractive index n2, and a graph (b) of FIG. 2b illustrates a case in which light travels from a medium having an refractive index n3 to a medium having an refractive index n4, and the refractive index n3 is substantially the same as the refractive index n4.

Referring to the graph (a) of FIG. 2b, when light travels from a medium having a high refractive index to a medium having a low refractive index, incident light is refracted on a boundary surface between the mediums, or light of the incident light having an incidence angle greater than a critical angle fails to pass through the boundary surface between the mediums, and is reflected. That is, when light travels from a medium having a high refractive index to a medium having a low refractive index, incident light may be distorted by refraction or reflection.

However, when light travels to the same medium as illustrated in the graph (b) of FIG. 2b, a distortion of light such as refraction or reflection does not occur on the boundary surface between the mediums, and light passes through the boundary surface between the mediums. For example, the medium having the refractive index n3 and the medium having the refractive index n4 may correspond to an upper substrate, a color filter, and a medium layer. Therefore, when light passes through mediums having different refractive indexes, it is preferable that refractive indexes of mediums disposed in a direction in which light travels be the same to minimize a distortion of light such as refraction or reflection that may occur on a boundary surface between mediums.

Referring to FIG. 2a, since the organic light emitting display 200 is a top emission type organic light emitting display, refractive indexes of elements disposed on an upper side of the organic light emitting display 200 are substantially the same to minimize interference due to external light from the outside, that is, to enhance visibility of the organic light emitting display 200. The medium layer 280 of the organic light emitting display 200 according to embodiments of the invention may have substantially the same refractive index as a refractive index of the upper substrate 215 to enhance visibility. A refractive index of the medium layer 280 may be about 1.5 which is substantially the same as a refractive index of the upper substrate 215. For example, at least one of glycerol, 1,2-propanediol, glycerine, trimethylopropane, triethanolamine, ethylene glycol, 1,3-propanediol, 1,4-butanediol, 1,8-octanediol, 1,2-butanediol, 2,3-butanediol, 1,2-pentanediol, etohexadiol, p-methane-3,8-diol, and 2-methyl-2,4-pentanediol may be included. Thus, in the organic light emitting display 200 according to embodiments of the invention, the medium layer 280 has substantially the same refractive index as the refractive index of the upper substrate 215, and the refractive index of the color filter 290 which has substantially the same refractive index as the refractive index of the upper substrate 215. Accordingly, visibility may be enhanced.

The medium layer 280 is formed of a material that inhibits permeation of gas and water molecules to the organic light emitting element similar to that of the desiccant 180A described in reference to FIG. 1a.

FIGS. 3a and 3b are conceptual diagrams illustrating an organic light emitting display for enhancing a viewing angle according to embodiments of the invention. FIG. 3a illustrates a case in which a face seal 385A is formed in a space between color filters 392A and 393A formed on an upper substrate and an anode 341A formed on a lower substrate, and FIG. 3b illustrates a case in which an upper substrate and a lower substrate are bonded together in a vacuum, and a spacer 360B and a desiccant 380B are disposed in a space between color filters 392B and 393B formed on the upper substrate and an anode 341B formed on the lower substrate as an organic light emitting display according to embodiments of the invention.

As described above, when a face seal scheme is used as a scheme of bonding the upper substrate and the lower substrate together, a face seal 385A may include a UV curable material or a thermosetting material. Since the face seal 385A is formed to have a thickness of about 100 μm to stably bond the upper substrate and the lower substrate together, a thickness of the face seal 385A corresponding to a size of a cell gap is about 100 μm.

On the other hand, an organic light emitting display according to embodiments of the invention uses the spacer 360B and the desiccant 380B together with a vacuum bonding scheme. Thus, a cell gap decreases to about 20 μm or less. Here, when a viewing angle is defined as θ, tan θ is a value obtained by dividing ½ of a width of black matrices 395A and 395B by a cell gap. Therefore, on the assumption that widths of the black matrices 395A and 395B are the same in FIGS. 3a and 3b, a viewing angle decreases as a size of a cell gap increases, and a viewing angle increases as a size of a cell gap decreases. Thus, when the organic light emitting display according to embodiments of the invention illustrated in FIG. 3b is used rather than using the face seal 385A as illustrated in FIG. 3a, a size of a cell gap is small and thus, a viewing angle increases. In addition, in an organic light emitting display according to embodiments of the invention, a viewing angle is increased by decreasing a size of a cell gap. Therefore, a width of the black matrix 395A may decrease and thus, an aperture ratio is enhanced to realize a high resolution display.

FIG. 4 is a flowchart illustrating a method of manufacturing an organic light emitting display according to embodiments of the invention. FIGS. 5a to 5g are cross-sectional views for each process illustrating a method of manufacturing an organic light emitting display according to embodiments of the invention.

In S40, an organic light emitting element and an encapsulation unit are formed on a lower substrate. To more specifically describe a process of forming the organic light emitting element and the encapsulation unit on the lower substrate, FIG. 5a is referred to.

Referring to FIG. 5a, a thin film transistor 520 is formed for each subpixel region of a lower substrate 510, and an organic light emitting element 540 is formed on the thin film transistor 520. After the thin film transistor 520 and the organic light emitting element 540 are formed, an encapsulation unit 550 for covering the thin film transistor 520 and the organic light emitting element 540 is formed. Forming of the thin film transistor 520, the organic light emitting element 540, and the encapsulation unit 550 is substantially the same as forming of the thin film transistor 120A, the organic light emitting element 140A, and the encapsulation unit 150A described with reference to FIG. 1a. Thus, repeated description is omitted.

Subsequently, a color filter is formed on the upper substrate in S41. To more specifically describe a process of forming the color filter on the upper substrate, FIGS. 5b to 5f are referred to.

Referring to FIGS. 5b to 5f, a black matrix 595 is formed in a boundary region of each subpixel region of an upper substrate 515 (see FIG. 5b), and a color filter 590 is formed in each subpixel region using the black matrix 595 as a boundary. Forming of the color filter 590 includes forming a red color filter 591 in a red subpixel region A (see FIG. 5c), forming a green color filter 592 in a green subpixel region B (see FIG. 5d), and forming a blue color filter 593 in a blue subpixel region C (see FIG. 5e). FIGS. 5b to 5e illustrates that the color filter 590 is formed in order of the red color filter 591, the green color filter 592, and the blue color filter 593 for convenience of description. However, the invention is not limited thereto, and the color filter 590 may be formed in various orders. Forming of the black matrix 595 and the color filter 590 is substantially the same as forming of the black matrix 195A and the color filter 190A described with reference to FIG. 1a. Thus, repeated description is omitted.

Subsequently, a spacer 560 may be formed on the upper substrate 515 where the color filter 590 is formed (see FIG. 5f). In this specification, the spacer 560 is formed on the upper substrate 515 for convenience of description. However, the spacer 560 may be formed on the lower substrate 510. Forming of the spacer 560 is substantially the same as forming of the spacer 160A described with reference to FIG. 1a. Thus, repeated description is omitted.

Subsequently, a medium layer is inserted between the lower substrate and the upper substrate in S42, and the lower substrate and the upper substrate are bonded together in a vacuum in S43. To more specifically describe inserting the medium layer between the lower substrate and the upper substrate, and bonding the lower substrate and the upper substrate together in a vacuum, FIG. 5g is referred to.

Referring to FIG. 5g, a desiccant 580 may be injected to fill a separation space between the lower substrate 510 and the upper substrate 515, and the desiccant 580 may fill a separation space between an adhesive member 570 and the encapsulation unit 550. When the lower substrate 510 and the upper substrate 515 are bonded together, the lower substrate 510 and the upper substrate 515 may be stuck to each other using the adhesive member 570 formed in an edge region E of the lower substrate 510 and the upper substrate 515. Bonding of the lower substrate 510 and the upper substrate 515 is substantially the same as bonding of the lower substrate 110A and the upper substrate 115A described with reference to FIG. 1a. Thus, repeated description is omitted.

Hereinafter, various characteristic of the organic light emitting display including a desiccant according to an embodiment of the invention will be described.

According to another characteristic of the present invention, the encapsulation unit corresponds to an inorganic thin film or a structure in which an organic thin film and an inorganic thin film are stacked.

According to still another characteristic of the present invention, the organic light emitting display further includes an adhesive member attaching the lower substrate and the upper substrate to each other.

According to still another characteristic of the present invention, the encapsulation unit and the adhesive member are separated from each other, and the desiccant fills a separation space between the encapsulation unit and the adhesive member.

According to still another characteristic of the present invention, the desiccant fills a separation space between the lower substrate and the upper substrate.

According to still another characteristic of the present invention, the organic light emitting display further includes a color filter formed in a portion of the upper substrate.

According to still another characteristic of the present invention, the color filter comes into contact with the spacer, and is formed to be separated from the encapsulation unit.

According to still another characteristic of the present invention, the lower substrate and the upper substrate are bonded together in a vacuum bonding scheme.

Hereinafter, various characteristic of the organic light emitting display including a medium layer for a refractive index matching according to an embodiment of the invention will be described.

According to another characteristic of the present invention, the medium layer inhibits penetration of water.

According to still another characteristic of the present invention, the medium layer fills a space formed between the lower substrate and the upper substrate.

According to still another characteristic of the present invention, the medium layer corresponds to a desiccant of a type of alcohol.

According to still another characteristic of the present invention, the desiccant of a type of alcohol corresponds to glycerin.

According to still another characteristic of the present invention, the organic light emitting display further includes an adhesive member attaching the lower substrate and the upper substrate to each other.

According to still another characteristic of the present invention, the lower substrate and the upper substrate are a glass substrate or a flexible substrate.

According to still another characteristic of the present invention, the organic light emitting display further includes a black matrix formed at a position corresponding to the spacer on the upper substrate; and a color filter formed at a position corresponding to the organic light emitting element on the upper substrate.

According to still another characteristic of the present invention, a refractive index of the color filter is substantially the same as a refractive index of the upper substrate.

Hereinafter, various characteristics of the organic light emitting display for enhancing visibility according to embodiments of the invention will be described.

According to another characteristic of the present invention, the organic light emitting display further includes a desiccant formed between the lower substrate and the upper substrate to inhibit penetration of water.

According to still another characteristic of the present invention, the desiccant corresponds to a desiccant of a type of alcohol.

According to still another characteristic of the present invention, the desiccant is in a gelled state or a liquid state.

According to still another characteristic of the present invention, the spacer is formed on a surface of the upper substrate, and comes into contact with the encapsulation unit.

According to still another characteristic of the present invention, further includes a black matrix formed at a position corresponding to the spacer on the upper substrate.

The exemplary embodiments of the present invention have been described in more detail with reference to the accompanying drawings, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

The invention claimed is:

1. An organic light emitting display, comprising:
a lower substrate including a plurality of subpixel regions;
a thin film transistor formed on the lower substrate;
an overcoating layer formed on the thin film transistor;

an organic light emitting element formed on the thin film transistor and the overcoating layer, and including a first electrode, an organic emission layer and a second electrode;

an encapsulation unit covering an entirety of the organic light emitting element;

a spacer formed on the encapsulation unit and being in directly contact with an upper surface of the encapsulation unit, with a separation space less than or equal to about 20 μm between the upper surface of encapsulation unit and an upper substrate disposed to face the lower substrate;

a desiccant fully filling the separation space in each subpixel region between the lower substrate and the upper substrate; and an adhesive member formed on edges of the overcoating layer, and attaching the lower substrate and the upper substrate to each other, wherein the encapsulation unit directly contacts the overcoating layer at edges of the overcoating layer, and only disposed in an inner space surrounded by the overcoating layer, the upper substrate and the adhesive member, wherein the encapsulation unit and the adhesive member are separated from each other by the desiccant in the inner space corresponding to edges of the overcoating layer, wherein each subpixel region includes an emissive area in which an actual image is displayed and a transmissive area transmitting external light, wherein the thin film transistor, the organic light emitting element and a color filter formed on the upper substrate are only disposed in the emissive area.

2. The organic light emitting display according to claim 1, wherein the encapsulation unit corresponds to an inorganic thin film or a structure in which an organic thin film and an inorganic thin film are stacked.

3. The organic light emitting display according to claim 1 the desiccant fills a separation space between the encapsulation unit and the adhesive member.

4. The organic light emitting display according to claim 1, wherein a light emitted from the organic light emitting element is discharged to the upper substrate.

5. The organic light emitting display according to claim 1, wherein the color filter comes into contact with the spacer, and is formed to be separated from the encapsulation unit.

6. The organic light emitting display according to claim 1, wherein the lower substrate and the upper substrate are bonded together in a vacuum bonding scheme.

7. The organic light emitting display according to claim 6, wherein a cell gap between the lower substrate and the upper substrate is less than or equal to 20 μm, and thereby a viewing angle increases.

8. An organic light emitting display, comprising:

a lower substrate on which an organic light emitting element on an overcoating layer and including an anode, an organic emission layer and a cathode, an encapsulation unit for covering an entirety of the organic light emitting element, the encapsulation unit having a structure in which an organic thin film and an inorganic thin film are stacked;

an upper substrate on which a color filter is formed;

a spacer disposed between the lower substrate and the upper substrate and being in directly contact with an upper surface of the encapsulation unit, with a separation space between the upper surface of encapsulation unit and the upper substrate;

a medium layer positioned between the lower substrate and the upper substrate, having substantially the same refractive index as a refractive index of the upper substrate and fully filling the separation space; and an adhesive member formed on edges of the overcoating layer, and attaching the lower substrate and the upper substrate to each other, wherein the encapsulation unit directly contacts the overcoating layer at edges of the overcoating layer, and only disposed in an inner space surrounded by the overcoating layer, the upper substrate and the adhesive member, wherein the encapsulation unit and the adhesive member are separated from each other by the medium layer in the inner space corresponding to edges of the overcoating layer, wherein the lower substrate includes a plurality of subpixel regions, each subpixel region includes an emissive area in which an actual image is displayed and a transmissive area transmitting external light, wherein the organic light emitting element and the color filter are only disposed in the emissive area.

9. The organic light emitting display according to claim 8, wherein the medium layer inhibits penetration of water.

10. The organic light emitting display according to claim 8, wherein the medium layer fills a space formed between the lower substrate and the upper substrate.

11. The organic light emitting display according to claim 8, wherein the medium layer corresponds to a desiccant of a type of alcohol.

12. The organic light emitting display according to claim 11, wherein the desiccant of the type of alcohol corresponds to glycerin.

13. The organic light emitting display according to claim 8, wherein the lower substrate and the upper substrate are a glass substrate or a flexible substrate.

14. The organic light emitting display according to claim 8, further comprising:

a black matrix formed at a position corresponding to the spacer on the upper substrate; and the color filter formed at a position corresponding to the organic light emitting element on the upper substrate.

15. The organic light emitting display according to claim 14, wherein a refractive index of the color filter is substantially the same as a refractive index of the upper substrate.

16. The organic light emitting display according to claim 8, wherein a cell gap between the lower substrate and the upper substrate is less than or equal to 20 μm, and thereby a viewing angle increases.

17. An organic light emitting display, comprising:

a lower substrate on which a thin film transistor, and an organic light emitting element on an overcoating layer and including an anode, an organic emission layer and a cathode are formed;

an encapsulation unit covering an entirety of the organic light emitting element formed on the lower substrate, the encapsulation unit having a structure in which an organic thin film and an inorganic thin film are stacked;

an upper substrate disposed to face the lower substrate;

a spacer disposed between the upper substrate and the lower substrate, being in directly contact with an upper surface of the encapsulation unit and maintaining a cell gap, with a separation space less than or equal to about 20 μm between the upper surface of encapsulation unit, a desiccant filling the separation space between the lower substrate and the upper substrate to inhibit penetration of water, the desiccant corresponding to a type of gelled state or a liquid state alcohol including carbon (C), hydrogen (H) and a hydroxyl group (OH), and an adhesive member formed on edges of the overcoating layer, and attaching the lower substrate and the upper substrate to each other, wherein the encapsulation unit being contacts the overcoating layer at edges of the overcoating layer, and only disposed in an inner space surrounded by the overcoating layer, the upper substrate and the adhesive member wherein the encapsulation unit and the adhesive member are separated from each other by desiccant in the inner space corresponding to at edges of the overcoating layer, wherein the lower substrate includes a plurality of subpixel regions, each subpixel region includes an emissive area in which an actual image is displayed and a transmissive area transmitting external light, wherein the thin film transistor, the organic light emitting element and a color filter formed on the upper substrate are only disposed in the emissive area.

18. The organic light emitting display according to claim 17, wherein the spacer is formed on a surface of the upper substrate.

19. The organic light emitting display according to claim 17, further comprising:

a black matrix formed at a position corresponding to the spacer on the upper substrate.

* * * * *